(12) United States Patent
Lee et al.

(10) Patent No.: US 7,548,469 B2
(45) Date of Patent: Jun. 16, 2009

(54) CIRCUIT AND METHOD OF GENERATING A BOOSTED VOLTAGE IN A SEMICONDUCTOR MEMORY DEVICE

(75) Inventors: Jae-Young Lee, Suwon-si (KR); Hong-Jun Lee, Suwon-si (KR); Jung-Hwa Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 362 days.

(21) Appl. No.: 11/640,857

(22) Filed: Dec. 19, 2006

(65) Prior Publication Data

US 2007/0153612 A1    Jul. 5, 2007

(30) Foreign Application Priority Data

Dec. 29, 2005    (KR)    ............... 10-2005-0132860

(51) Int. Cl.
*G11C 7/00*    (2006.01)
(52) U.S. Cl. ............................. 365/189.11; 365/226
(58) Field of Classification Search ............ 365/189.11, 365/226
See application file for complete search history.

(56) References Cited

U.S. PATENT DOCUMENTS

| | | | | |
|---|---|---|---|---|
| 5,699,289 A | * | 12/1997 | Takenaka | ................ 365/51 |
| 5,909,141 A | * | 6/1999 | Tomishima | ................ 327/536 |
| 6,229,753 B1 | * | 5/2001 | Kono et al. | ................ 365/63 |
| 6,278,316 B1 | | 8/2001 | Tanzawa et al. | |
| 6,449,182 B1 | * | 9/2002 | Ooishi | ................ 365/63 |
| 6,535,439 B2 | | 3/2003 | Cowles | |
| 6,545,918 B2 | * | 4/2003 | Song | ................ 365/189.11 |
| 6,768,692 B2 | * | 7/2004 | Luk et al. | ................ 365/205 |
| 6,804,150 B2 | | 10/2004 | Park et al. | |
| 6,809,573 B2 | | 10/2004 | Kim | |
| 7,054,211 B2 | * | 5/2006 | Tsujimura et al. | ................ 365/204 |

FOREIGN PATENT DOCUMENTS

KR    102030009082 A    1/2003

\* cited by examiner

*Primary Examiner*—Tuan T. Nguyen
(74) *Attorney, Agent, or Firm*—Volentine & Whitt, PLLC

(57) ABSTRACT

A circuit generates a boosted voltage in a semiconductor memory device, where the semiconductor memory device includes a memory cell array having a plurality of non-edge sub-arrays and at least one edge sub-array. The circuit includes a plurality of boosted voltage generators configured to generate a boosted voltage having different current driving capabilities to activate the non-edge sub-arrays and the edge sub-arrays and to supply the boosted voltage to the memory cell array.

29 Claims, 10 Drawing Sheets

CIRCUIT AND METHOD OF GENERATING A BOOSTED VOLTAGE IN A SEMICONDUCTOR MEMORY DEVICE

BACKGROUND OF THE INVENTION

1. Field of the Invention

The present invention relates to a semiconductor memory device and, more particularly, to a circuit and a method of generating a boosted voltage for a semiconductor memory device including memory cell arrays.

A claim of priority under 35 U.S.C. § 119 is made to Korean Patent Application No. 2005-132860, filed on Dec. 29, 2005, in the Korean Intellectual Property Office, the disclosure of which is incorporated herein by reference in its entirety.

2. Description of the Related Art

There are a number of ways in which one may classify semiconductor memory devices. For example, semiconductor memory devices may be classified, according to a structure of memory cell arrays in the device. In this case, semiconductor memory devices may be classified into semiconductor memory devices having a folded bit line structure and semiconductor memory devices having an open bit line structure. Specifically, semiconductor memory devices may be classified into semiconductor memory devices having an 8F2 structure and semiconductor memory devices having a 6F2 structure based on an area that is occupied by a unit memory cell. To this end, in general, a semiconductor memory device having a folded bit line structure has the 8F2 structure and a semiconductor memory device having an open bit line structure has the 6F2 structure.

FIG. 1 is a circuit diagram illustrating a conventional memory cell array having an open bit line structure, which is disclosed in detail in U.S. patent application Ser. No. 6,535,439.

Referring to FIG. 1, the memory cell array 100 includes edge sub-arrays 120 and 140, non-edge sub-arrays 130, and sense amplifiers 151 through 159. Furthermore, the non-edge sub-arrays 130 include bit lines corresponding to horizontal lines and word lines corresponding to vertical lines. In addition, memory cells are located at the intersecting points of word lines and bit lines and at the intersecting points of word lines and dummy bit lines. In particular, the intersecting points are represented as dots in FIG. 1. As also shown in FIG. 1, a first bit line BL is coupled at one side of each of the sense amplifiers 154, 155, and 156 and a second bit line BLB is coupled at the other side of each of the sense amplifiers 154, 155, and 156. Furthermore, dummy bit lines DBL11, DB12, and DBL1n are coupled to one side of the sense amplifiers 151, 152 and 153, and a supply voltage VCC/2 is coupled to the other side of the sense amplifiers 151, 152 and 153. Similarly, dummy bit lines DBL21, DBL22, and DBL2n are coupled to one side of the sense amplifiers 157, 158, and 159, and a supply voltage VCC/2 is coupled to the other side of the sense amplifiers 157, 158, and 159.

FIG. 2 is a block diagram illustrating a conventional memory cell array including sub-arrays. Moreover, the sub-arrays include edge sub-arrays and non-edge sub-arrays. Furthermore, the non-edge sub-arrays are activated as shown in FIG. 2.

Referring to FIG. 2, the memory cell array 200 includes sub-arrays 210, 220, 230, 240, and 250. Furthermore, the memory cell array 200 is divided into two memory blocks BLOCK1 and BLOCK2. In addition, the sub-arrays 220 and 240 are non-edge sub-arrays, and the sub-arrays 210, 230 and 250 are edge sub-arrays. In FIG. 2, the non-edge sub-arrays 220 and 240 are activated at the same time in response to a word line enable signal WLE.

FIG. 3 is a block diagram illustrating a conventional memory cell array including edge sub-arrays that are activated in response to a common signal. Referring to FIG. 3, the memory cell array 300 includes sub-arrays 310, 320, 330, 340 and 350. Furthermore, the memory cell array 300 is divided into two memory blocks BLOCK1 and BLOCK2. In FIG. 3, the sub-arrays 320 and 340 are non-edge sub-arrays, and the sub-arrays 310, 330 and 350 are edge sub-arrays. Furthermore, the edge sub-arrays 310, 330, and 350 are activated at the same time in response to a word line enable signal WLE.

As seen above, in FIG. 2, two non-edge sub-arrays are activated at the same time, whereas in FIG. 3, three edge sub-arrays are activated at the same time. Thus, a number of non-edge sub-arrays that are activated at the same time may be different from a number of edge sub-arrays that are activated at the same time.

Accordingly, there may be a need for a boosted voltage generating circuit for generating a boosted voltage, where the circuit has different current driving capabilities for activating non-edge sub-arrays and edge sub-arrays.

SUMMARY OF THE INVENTION

One aspect of the present disclosure includes a circuit for generating a boosted voltage in a semiconductor memory device, the semiconductor memory device including a memory cell array having a plurality of non-edge sub-arrays and at least one edge sub-array. The circuit comprises a plurality of boosted voltage generators configured to generate a boosted voltage having different current driving capabilities to activate the non-edge sub-arrays and the edge sub-arrays and to supply the boosted voltage to the memory cell array.

Another aspect of the present disclosure includes a semiconductor memory device. The semiconductor memory device includes a memory cell array including a plurality of non-edge sub-arrays and a plurality of edge sub-arrays. The device also includes a boosted voltage generating circuit configured to generate a boosted voltage having different current driving capabilities to activate the non-edge sub-arrays and the edge sub-arrays and to supply the boosted voltage to the memory cell array.

Yet another aspect of the present disclosure includes a method of generating a boosted voltage. The method includes generating a boosted voltage having different current driving capabilities for activating non-edge sub-arrays and edge sub-arrays. The method also includes supplying the boosted voltage to the non-edge sub-arrays and the edge sub-arrays.

BRIEF DESCRIPTION OF THE DRAWINGS

The foregoing and other features of the invention will be apparent from the more a particular description of exemplary embodiments of the invention, as illustrated in the accompanying drawings. The drawings are not necessarily to scale, emphasis instead being placed upon illustrating the principles of the invention. Like reference characters refer to like elements throughout the drawings.

DESCRIPTION OF THE EMBODIMENTS

Figure 1:
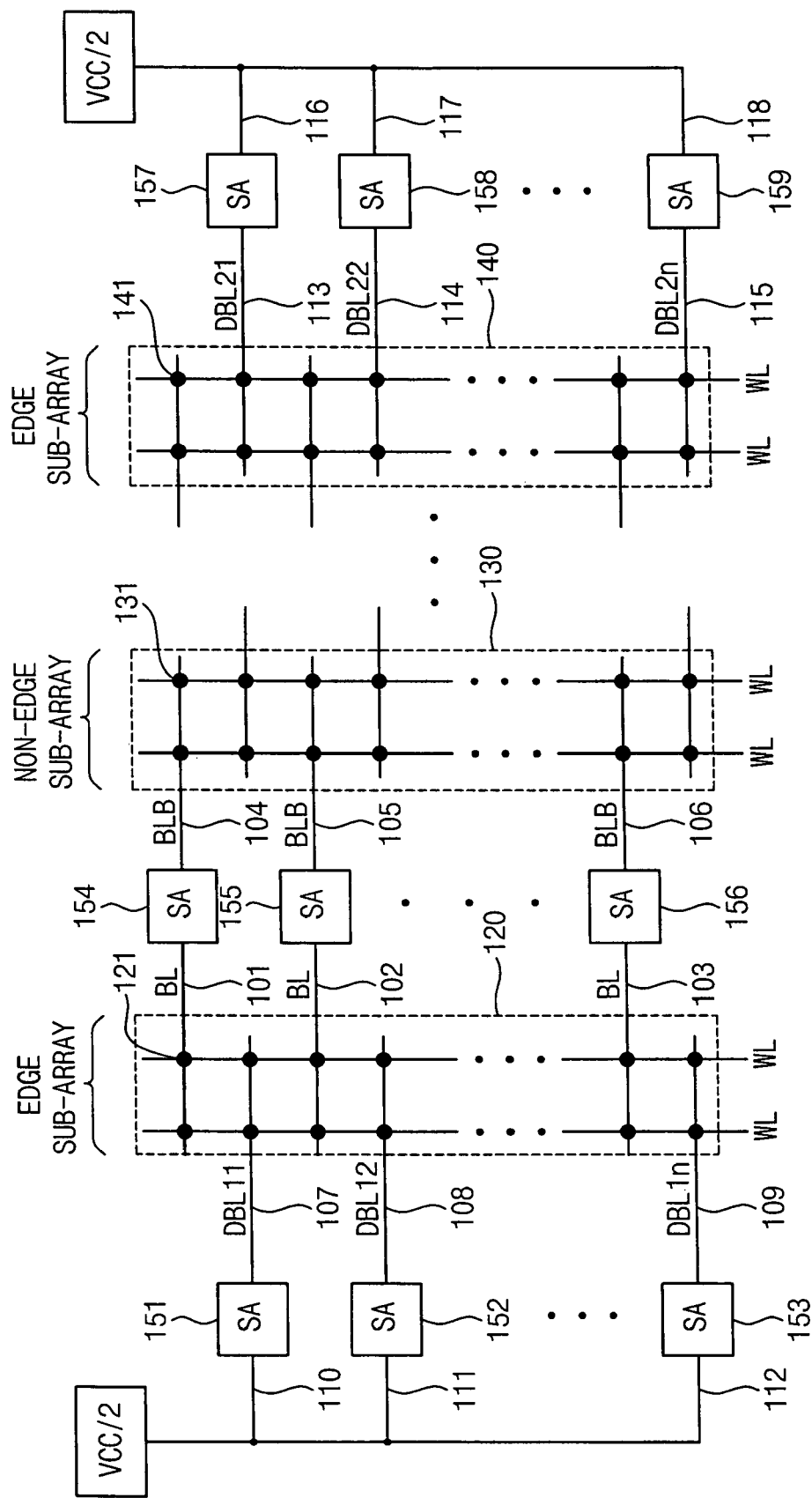
FIG. 1 is a circuit diagram illustrating a conventional memory cell array having an open bit line structure.

Exemplary embodiments of the present invention now will be described more fully with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an", and "the" are intended to include the plural forms as well, unless the context clearly indicates otherwise. It will be further understood that the terms "comprises," "comprising," "includes", and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
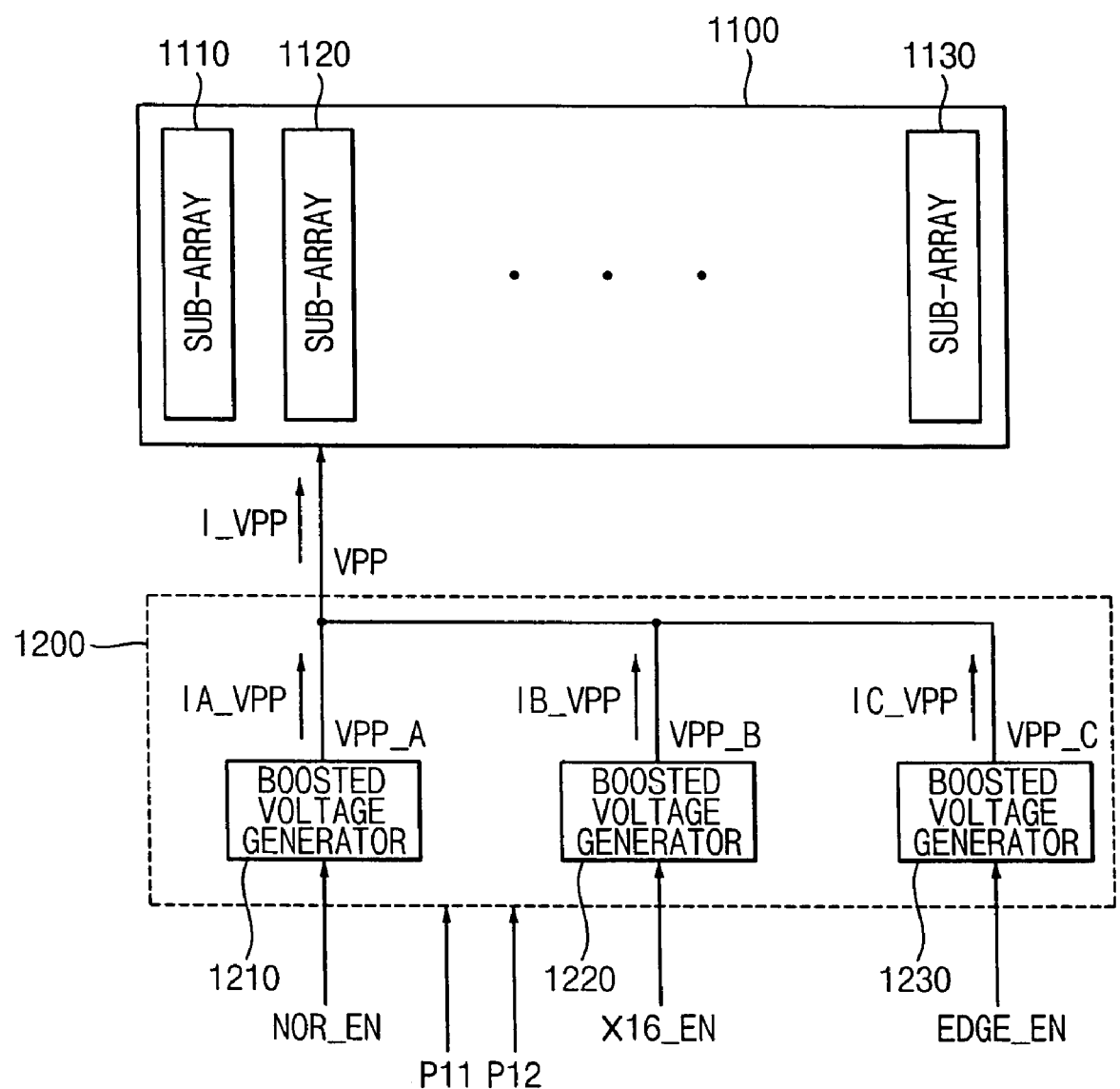
FIG. 4 is a block diagram illustrating a semiconductor memory device including a boosted voltage generating circuit according to an exemplary disclosed embodiment of the present invention.

FIG. 4 is a block diagram illustrating a semiconductor memory device including a boosted voltage generating circuit according to an exemplary disclosed embodiment.

Referring to FIG. 4, the semiconductor memory device 1000 may include a memory cell array 1100 and a boosted voltage generating circuit 1200. Furthermore, the memory cell array 1100 may include sub-arrays 1110, 1120 and 1130. In addition, the boosted voltage generating circuit 1200 may include a first boosted voltage generator 1210, a second boosted voltage generator 1220, and a third boosted voltage generator 1230.

In general, the boosted voltage generating circuit 1200 may generate a boosted voltage VPP and a boosted current I_VPP in response to pulse signals P11 and P12, a first output control signal NOR_EN, a second output control signal X16_EN, and a third output control signal EDGE_EN. Furthermore, the sub-array 1120 corresponds to a non-edge sub-array and the sub-arrays 1110 and 1130 correspond to edge sub-arrays.

The first boosted voltage generator 1210 generates a first boosted voltage VPP_A. This first boosted voltage VPP A may be used for activating the non-edge sub-arrays 1120 included in the memory cell array 1100. Specifically, the first boosted voltage generator 1210 supplies the first boosted voltage VPP_A to the memory cell array 1100 in response to the first output control signal NOR_EN. Similarly, the second boosted voltage generator 1220 generates a second boosted voltage VPP_B for activating the non-edge sub-arrays 1120 and edge sub-arrays 1110 and 1130 included in the memory cell array 1100. Furthermore, the second boosted voltage generator 1220 supplies the second boosted voltage VPP_B to the memory cell array 1100 in response to the second output control signal X16_EN. In addition, the third boosted voltage generator 1230 generates a third boosted voltage VPP_C for activating the edge sub-arrays 1110 and 1130 included in the memory cell array 1100. Moreover, the third boosted voltage generator 1230 supplies the third boosted voltage VPP_C to the memory cell array 1100 in response to the third output control signal EDGE_EN.

An operation of the semiconductor memory device 1000 including the boosted voltage generating circuit 1200 shown in FIG. 4 is described below.

Figure 2:
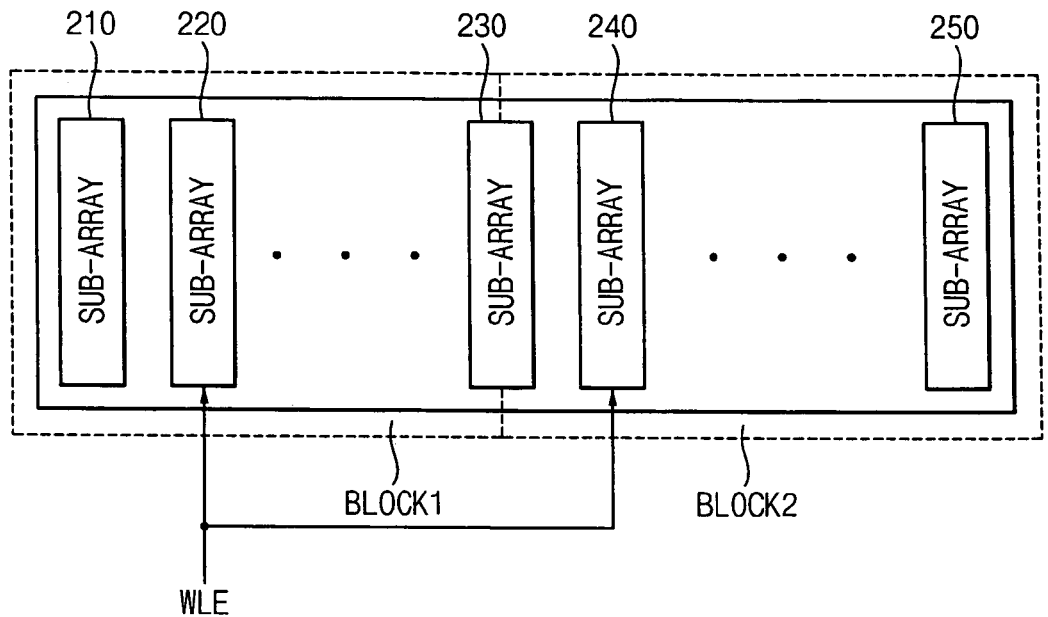
FIG. 2 is a block diagram illustrating a conventional memory cell array including sub-arrays where non-edge sub-arrays are activated.
Figure 3:
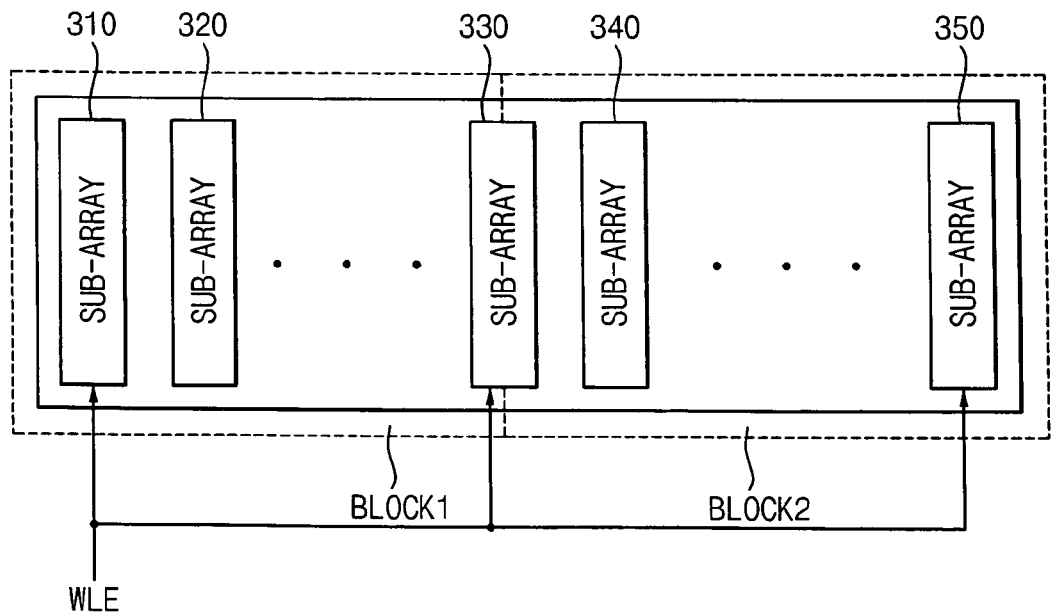
FIG. 3 is a block diagram illustrating a conventional memory cell array including sub-arrays where edge sub-arrays are activated.

The memory cell array 1100 includes the sub-arrays 1110, 1120 and 1130. Specifically, the sub-arrays 1110 and 1130 correspond to edge sub-arrays and the sub-array 1120 corresponds to a non-edge sub-array. When the semiconductor memory device 1000 has a data input/output architecture of X16, the memory cell array 1100 may be divided into two memory blocks as shown in FIG. 2 or FIG. 3. Alternatively, when the semiconductor memory device 1000 has a data input/output architecture of X4 or X8, the memory cell array 1100 may be comprised of one block.

The boosted voltage VPP, which is an output voltage of the boosted voltage generating circuit 1200, may be equal to the boosted voltages VPP_A, VPP_B, and VPP_C that are generated by the boosted voltage generators 1210, 1220, and 1230, respectively. However, the output current I_VPP may be equal to a sum of output currents IA_VPP, IB_VPP, and IC_VPP of the boosted voltage generators 1210,1220, and 1230, respectively.

The first boosted voltage generator 1210 outputs the boosted voltage VPP and a first boosted current IA_VPP to enable the non-edge sub-arrays 1120 regardless of a data input/output architecture of the semiconductor memory device. Furthermore, the second boosted voltage generator 1220 outputs the boosted voltage VPP and a second boosted current IB_VPP to enable the non-edge sub-arrays 1120 or the edge sub-arrays 1110 and 1130 when the semiconductor memory device 1000 has a data input/output architecture of X16. Moreover, the third boosted voltage generator 1230 outputs the boosted voltage VPP and a third boosted current IC_VPP to enable the edge sub-arrays 1110 and 1130 regardless of a data input/output architecture.

When the semiconductor memory device 1000 has a data input/output architecture of X4 or X8, the first boosted voltage generator 1210 outputs the boosted voltage VPP and the first boosted current IA_VPP to enable the non-edge sub-arrays 1120. At this time, the second boosted voltage generator 1220 and the third boosted voltage generator 1230 do not output the boosted voltage VPP and the second and the third boosted currents IB_VPP and IC_VPP. Therefore, in a case where the semiconductor memory device 1000 has a data input/output architecture of X4 or X8, the output current I_VPP of the boosted voltage generating circuit 1200 is equal to the first output current IA_VPP of the first boosted voltage generator 1210 when the non-edge sub-arrays 1120 are enabled.

Furthermore, when the semiconductor memory device 1000 has a data input/output architecture of X4 or X8, the first boosted voltage generator 1210 may also output the boosted voltage VPP and the first boosted current IA_VPP to enable the edge sub-arrays 1110 and 1130. At this time, the second boosted voltage generator 1220 does not output the boosted voltage VPP and the second boosted currents IB_VPP, but the third boosted voltage generator 1230 outputs the boosted voltage VPP and the third boosted current IC_VPP. Therefore, in a case where the semiconductor memory device 1000 has a data input/output architecture of X4 or X8, the output current I_VPP of the boosted voltage generating circuit 1200 is equal to a sum of the first output current IA_VPP of the first boosted voltage generator 1210 and the third output current IC_VPP of the third boosted voltage generator 1230, when the edge sub-arrays 1110 and 1130 are enabled.

When the semiconductor memory device 1000 has a data input/output architecture of X16, the first boosted voltage generator 1210 outputs the boosted voltage VPP and the first boosted current IA_VPP to enable the non-edge sub-arrays 1120. At this time, the second boosted voltage generator 1220 outputs the boosted voltage VPP and the second boosted currents IB_VPP, but the third boosted voltage generator 1230 does not output the boosted voltage VPP and the third boosted current IC_VPP. Therefore, in a case where the semiconductor memory device 1000 has a data input/output architecture of X16, the output current I_VPP of the boosted voltage generating circuit 1200 is equal to a sum of the first output current IA_VPP of the first boosted voltage generator 1210 and the second output current IB_VPP of the second boosted voltage generator 1220 when the non-edge sub-arrays 1120 are enabled.

When the semiconductor memory device 1000 has a data input/output architecture of X16, the first boosted voltage generator 1210 outputs the boosted voltage VPP and the first boosted current IA_VPP to enable the edge sub-arrays 1110 and 1130. At this time, the second boosted voltage generator 1220 outputs the boosted voltage VPP and the second boosted current IB_VPP, and the third boosted voltage generator 1230 outputs the boosted voltage VPP and the third boosted current IC_VPP. Therefore, in a case where the semiconductor memory device 1000 has a data input/output architecture of X16, the output current I_VPP of the boosted voltage generating circuit 1200 is equal to a sum of the first output current IA_VPP of the first boosted voltage generator 1210, the second output current IB_VPP of the second boosted voltage generator 1220, and the third output current IC_VPP of the third boosted voltage generator 1230 when the edge sub-arrays 1110 and 1130 are enabled.

Accordingly, when the semiconductor memory device 1000 has a data input/output architecture of X4 or X8, only the first boosted voltage generator 1210 outputs the boosted voltage VPP to enable the non-edge sub-arrays 1120. However, when the semiconductor memory device 1000 has a data input/output architecture of X4 or X8, the first boosted voltage generator 1210 and the third boosted voltage generator 1230, output the boosted voltage VPP to enable the edge sub-arrays 1110 and 1130.

Furthermore, when the semiconductor memory device 1000 has a data input/output architecture of X16, the first boosted voltage generator 1210 and the second boosted voltage generator 1220, output the boosted voltage VPP to enable the non-edge sub-arrays 1120. In addition, when the semiconductor memory device 1000 has a data input/output architecture of X16, the first boosted voltage generator 1210, the second boosted voltage generator 1220, and the third boosted voltage generator 1230, output the boosted voltage VPP to enable the edge sub-arrays 1110 and 1130.

When the semiconductor memory device 1000 has a data input/output architecture of X4 or X8, a memory bank in the memory cell array 1100 may be comprised of, for example, one block, and may include a plurality of non-edge sub-arrays and two edge sub-arrays. More particularly, in a case where the semiconductor memory device 1000 has a data input/output architecture of X4 or X8, one sub-array is activated at a time when the non-edge sub-arrays 1120 are enabled, and two sub-arrays are activated at a time when the edge sub-arrays are enabled.

On the other hand, when the semiconductor memory device 1000 has a data input/output architecture of X16, the memory cell array 1100 may be divided into four memory banks. In addition, each of the memory banks may be comprised of two memory blocks, and may include a plurality of non-edge sub-arrays and three edge sub-arrays. More particularly, in a case where the semiconductor memory device 1000 has a data input/output architecture of X16, two sub-arrays are activated at a time when the non-edge sub-arrays are enabled, and three sub-arrays are activated at a time when the edge sub-arrays are enabled.

As discussed above, the boosted voltage generating circuit 1200 of the semiconductor memory device 1000 shown in FIG. 4 generates the boosted voltage VPP with different current driving capabilities for activating the non-edge sub-arrays and the edge sub-arrays in the memory cell 1100. Specifically, the boosted voltage generating circuit 1200 generates the boosted voltage VPP with different current driving capabilities according to the data input/output architectures of the memory device 1000. Therefore, the boosted voltage generating circuit 1200 of the semiconductor memory device 1000 shown in FIG. 4 may generate the boosted voltage VPP with different current driving capabilities based on the data input/output architectures and types of sub-arrays in the memory cell array 1100.

Because the boosted voltage generating circuit 1200 may provide a boosted voltage VPP with different current driving capabilities, the boosted voltage generating circuit 1200 of the semiconductor memory device 1000 may provide the boosted voltage VPP with a desired current driving capability to drive the memory cell array 1100.

Figure 5:
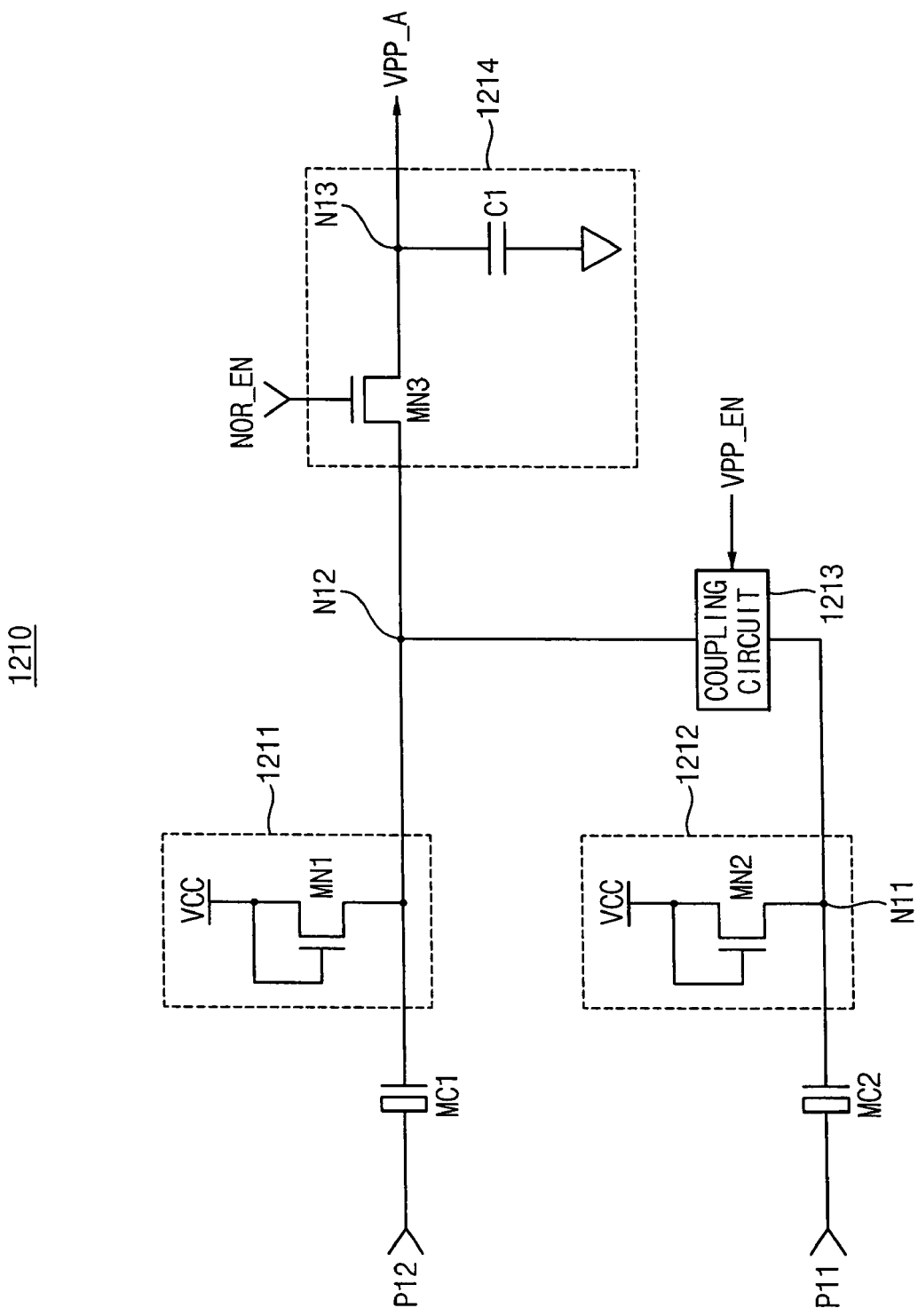
FIG. 5 is a circuit diagram illustrating a first boosted voltage generator included in the boosted voltage generating circuit shown in FIG. 4.

FIG. 5 is a circuit diagram illustrating a first boosted voltage generator included in the boosted voltage generating circuit shown in FIG. 4.

Referring to FIG. 5, the first boosted voltage generator 1210 includes precharge circuits 1211 and 1212, capacitors MC1 and MC2 and a coupling circuit 1213. In particular, the precharge circuit 1211 may include a diode-connected NMOS transistor MN1 and the precharge circuit 1212 may include a diode-connected NMOS transistor MN2.

The precharge circuit 1212 precharges a node N11 based on a supply voltage VCC and the precharge circuit 1211 precharges a node N12 based on the supply voltage VCC. Furthermore, the capacitor MC2 boosts a voltage of the node N11 in response to a first pulse signal P11 and the capacitor MC1 boosts a voltage of the node N12 in response to a second pulse signal P12. In addition, the coupling circuit 1213 electrically couples the node N11 to the node N12 in response to a boost enable signal VPP_EN. To this end, the voltage of the node N12 corresponds to the boosted voltage VPP.

Furthermore, the first boosted voltage generator 1210 may also include a transfer circuit 1214. This transfer circuit 1214 may be used for outputting the voltage of the node N12. In particular, the transfer circuit 1214 may include an NMOS transistor MN3 and a capacitor C1

An operation of the first boosted voltage generator 1210 in FIG. 5 will now be described.

At the outset, the first and the second pulse signals P11 and P12 and the first output enable signal NOR_EN are voltage signals that vary between a ground voltage (i.e., 0V) and the supply voltage VCC.

The first boosted voltage generator 1210 may have a double boosting structure. First, the node N11 is precharged to VCC-Vth by the precharge circuit 1212. Here, Vth denotes a threshold voltage of the NMOS transistor MN2. Furthermore, the voltage of the node N11 is boosted by the capacitor MC2 in response to the first pulse signal P11. During the boosting operation, the first pulse signal P11 has a voltage level of the supply voltage VCC. For example, when the supply voltage VCC is 3.0V and Vth is 0.5V, the voltage of the node N11 becomes about 5.5V (i.e., 3.0V−0.5V+3.0V), and the voltage level of the node N12 becomes about 2.5V (i.e., 3.0V−0.5V).

As described above, the node N11 and the node N12 are electrically coupled by the coupling circuit 1213 and charge is shared between the two nodes N11 and N12. To this, the coupling circuit 1213 may include a transistor for electrically connecting the node N11 and the node N12. When a process of charge sharing is completed, both the voltage level of the node N11 and the voltage level of the node N12 become about 4.0V (i.e., (5.5V+2.5V)/2).

Furthermore, the voltage of the node N12 is boosted by the capacitor MC1 in response to the second pulse signal P12. During the boosting operation, the second pulse signal P12 has a voltage level of VCC. For example, when the supply voltage VCC is 3.0V and Vth is 0.5V, the voltage level of the node N12 becomes about 7.0V (=4.0V+3.0V). The transfer circuit 1214 may be used to provide external circuits with the voltage of the node N12.

In FIG. 5, the output voltage of the first boosted voltage generator 1210 is denoted as VPP_A. This denotation is made in order to differentiate the output voltage of the first boosted generator 1210 from the output voltages of the second boosted voltage generator 1220 and the third boosted voltage generator 1230.

Figure 6:
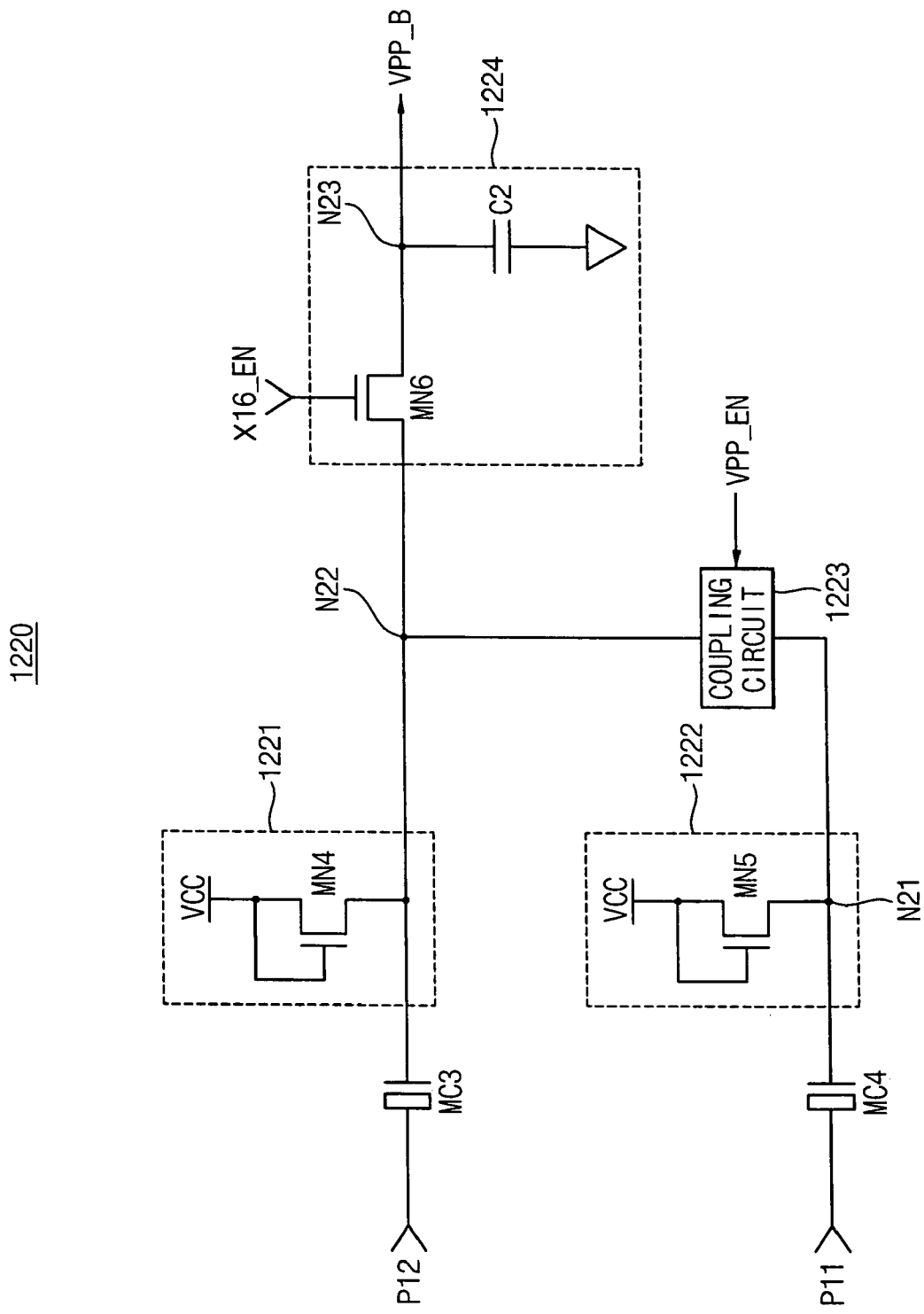
FIG. 6 is a circuit diagram illustrating a second boosted voltage generator included in the boosted voltage generating circuit shown in FIG. 4.

FIG. 6 is a circuit diagram illustrating a second boosted voltage generator included in the boosted voltage generating circuit in FIG. 4.

Referring to FIG. 6, the second boosted voltage generator 1220 includes precharge circuits 1221 and 1222, capacitors MC3 and MC4, and a coupling circuit 1223. Specifically, the precharge circuit 1221 may include a diode-connected NMOS transistor MN4, and the precharge circuit 1222 may include a diode-connected NMOS transistor MN5.

The structure and operation of the second boosted voltage generator 1220 in FIG. 6 is similar to that of the first boosted voltage generator 1210 in FIG. 5. Therefore, a description of the second boosted voltage generator 1220 in FIG. 6 is omitted. One should note that in FIG. 6, the output voltage of the second boosted voltage generator 1220 is denoted as VPP_B in order to differentiate it from the output voltages of the first boosted voltage generator 1210 and the third boosted voltage generator 1230.

Figure 7:
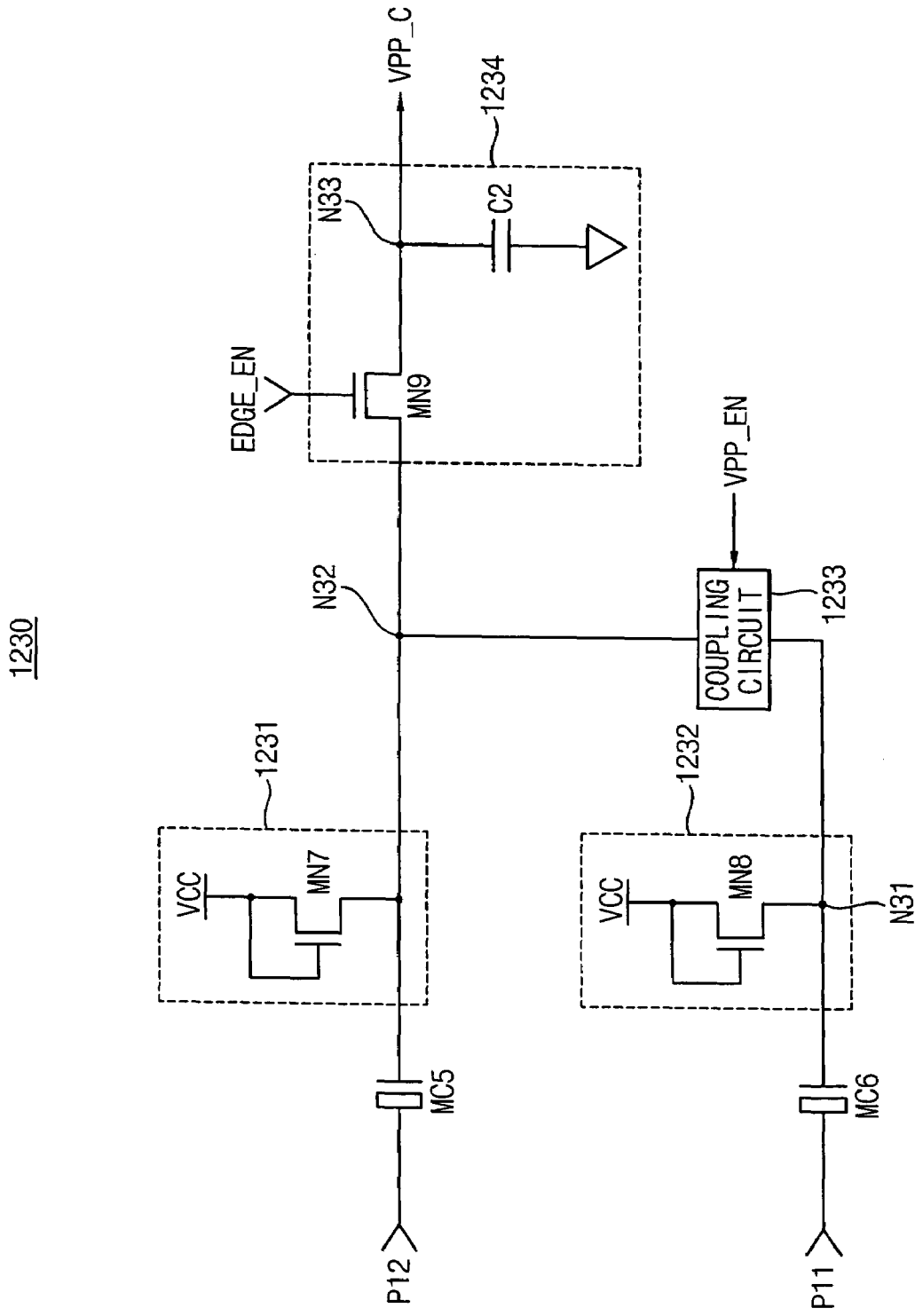
FIG. 7 is a circuit diagram illustrating a third boosted voltage generator included in the boosted voltage generating circuit shown in FIG. 4.

FIG. 7 is a circuit diagram illustrating a third boosted voltage generator included in the boosted voltage generating circuit in FIG. 4.

Referring to FIG. 7, the third boosted voltage generator 1230 may include precharge circuits 1231 and 1232, capacitors MC5 and MC6, and a coupling circuit 1233. The precharge circuit 1231 may include a diode-connected NMOS transistor MN7 and the precharge circuit 1232 may include a diode-connected NMOS transistor MN8.

The structure and operation of the third boosted voltage generator 1230 in FIG. 7 is similar to that of the first boosted voltage generator 1210 in FIG. 5. Therefore, a description of the third boosted voltage generator 1230 in FIG. 7 is omitted. Again, one should note that in FIG. 7, the output voltage of the third boosted voltage generator 1230 is denoted as VPP_C in order to differentiate it from the output voltages of the first boosted voltage generator 1210 and the second boosted voltage generator 1220.

Figure 8:
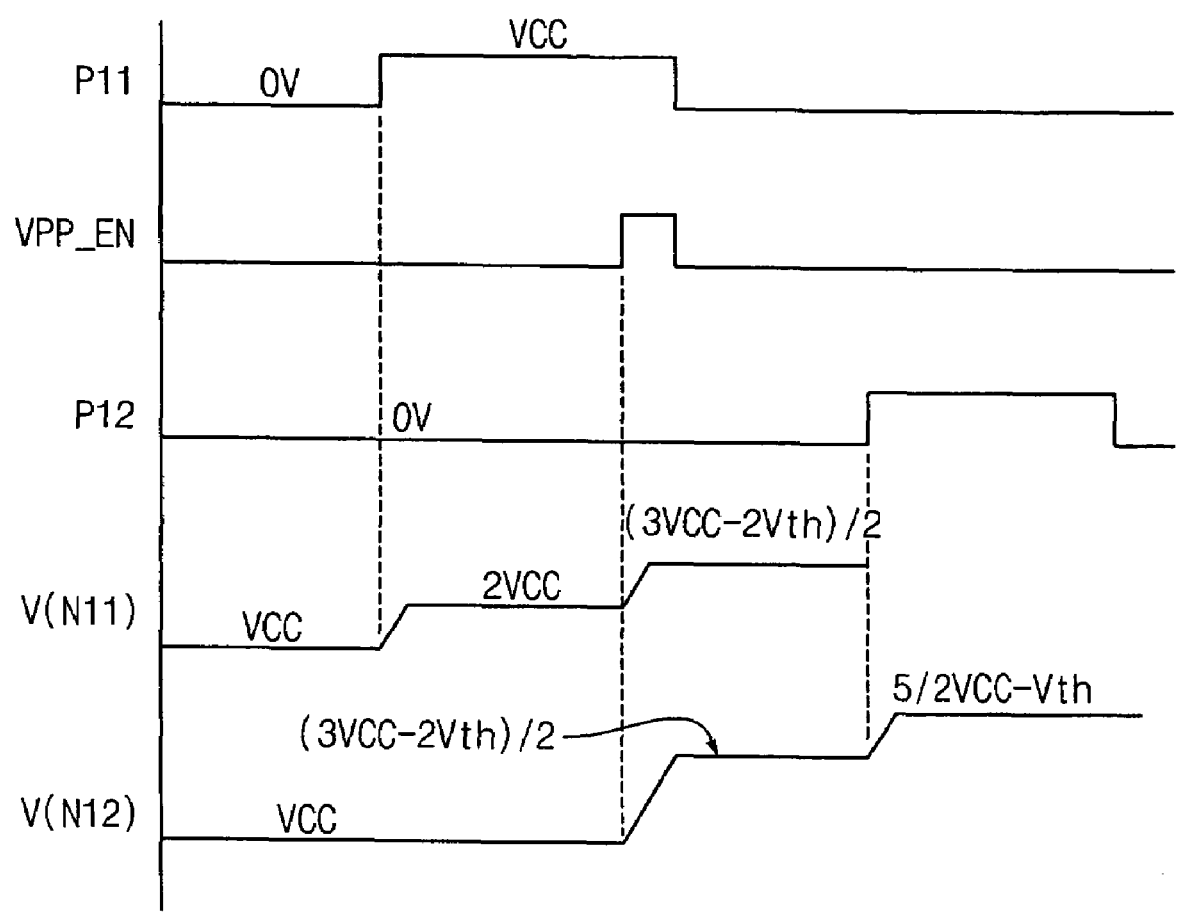
FIG. 8 is a diagram showing waveforms for some nodes of the boosted voltage generators shown in FIG. 5, FIG. 6 and FIG. 7.

FIG. 8 is a diagram showing waveforms for some nodes of the boosted voltage generators shown in FIG. 5, FIG. 6 and FIG. 7.

Referring to FIG. 8, the node N11 and the node N12 are charged to (3VCC−2Vth)/2 in response to the boost enable signal VPP_EN. Furthermore, the voltage level of node N12 is boosted to as much as VCC in response to the second pulse signal P12 and therefore becomes 5/2*VCC-Vth.

Figure 9:
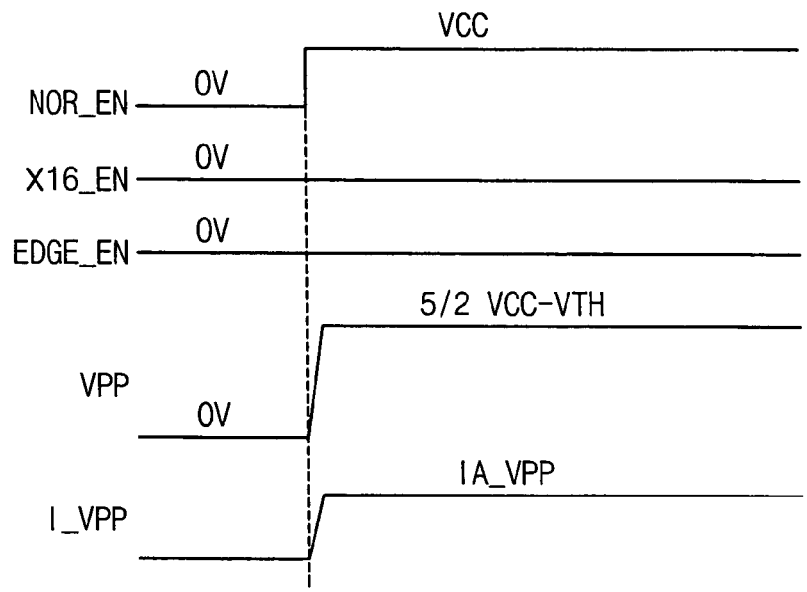
FIG. 9 is a diagram showing waveforms for a boosted voltage and a boosted current when the non-edge sub-arrays for the memory cell array shown in FIG. 4 are activated, in a case where the memory cell array has a data architecture of X4 or X8.

FIG. 9 is a diagram showing waveforms for a boosted voltage and a boosted current when the non-edge sub-arrays for the memory cell array shown in FIG. 4 are activated, in a case where the memory cell array has a data architecture of X4 or X8.

Referring to FIG. 9, when the memory cell array 1100 has a data architecture of X4 or X8 and non-edge sub-arrays in the memory cell array 1100 are activated, the first output control signal NOR_EN is enabled, but the second output control signal X16_EN and the third output control signal EDGE_EN are disabled. At this time, the output voltage of the boosted voltage generating circuit 1200 in FIG. 4, that is, the boosted voltage VPP, has a value of about 5/2*VCC-Vth and the boosted current I_VPP has a value of the first output current IA_VPP of the first boosted voltage generator 1210 shown in FIG. 4.

Figure 10:
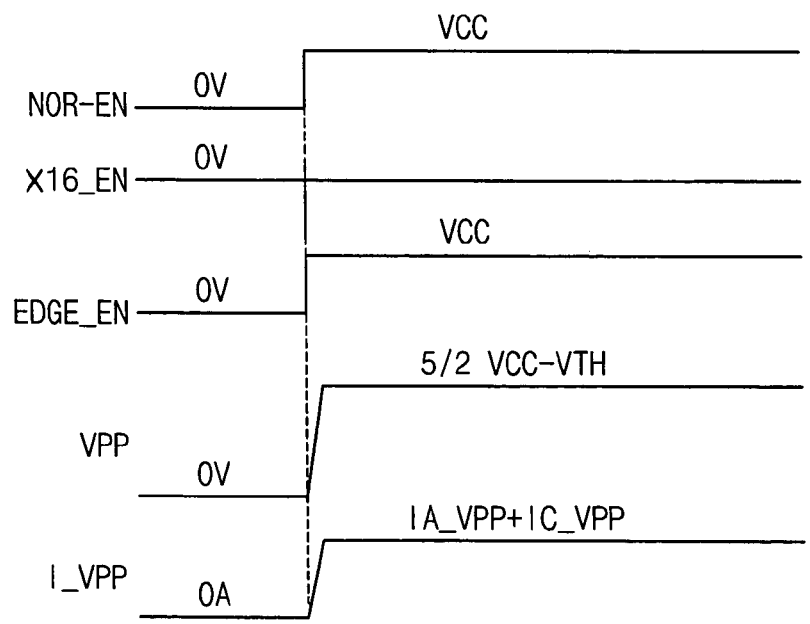
FIG. 10 is a diagram showing waveforms for a boosted voltage and a boosted current when the edge sub-arrays for the memory cell array shown in FIG. 4 are activated, in a case where the memory cell array has a data architecture of X4 or X8.

FIG. 10 is a diagram showing waveforms for a boosted voltage and a boosted current when the edge sub-arrays for the memory cell array shown in FIG. 4 are activated, in a case where the memory cell array has a data architecture of X4 or X8.

Referring to FIG. 10, when the memory cell array 1100 has a data architecture of X4 or X8, and edge sub-arrays of the memory cell array 1100 are activated, the first output control signal NOR_EN and the third output control signal EDGE_EN are enabled, but the second output control signal X16_EN is disabled. At this time, the output voltage of the boosted voltage generating circuit 1200 in FIG. 4, that is, the boosted voltage VPP, has a value of about 5/2*VCC-Vth, and the boosted current I_VPP is a sum of the first output current IA_VPP of the first boosted voltage generator 1210 shown in FIG. 4 and the third output current IC_VPP of the third boosted voltage generator 1230 shown in FIG. 4.

Figure 11:
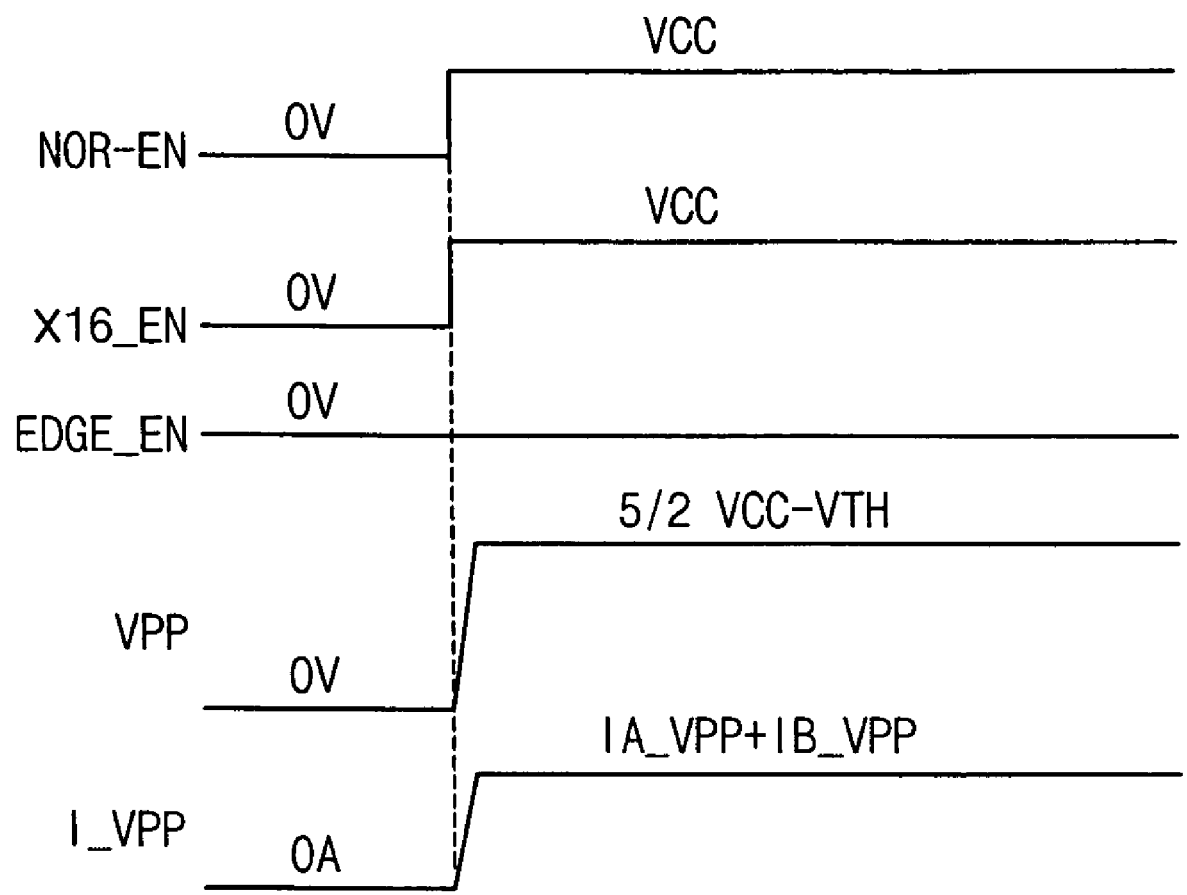
FIG. 11 is a diagram showing waveforms for a boosted voltage and a boosted current when the non-edge sub-arrays for the memory cell array shown in FIG. 4 are activated, in a case where the memory cell array has a data architecture of X16.

FIG. 11 is a diagram showing waveforms for a boosted voltage and a boosted current when the non-edge sub-arrays for the memory cell array shown in FIG. 4 are activated, in a case where the memory cell array has a data architecture of X16.

Referring to FIG. 11, when the memory cell array 1100 has a data architecture of X16 and non-edge sub-arrays of the memory cell array are activated, the first output control signal NOR_EN and the second output control signal X16_EN are enabled, but the third output control signal EDGE_EN is disabled. At this time, the output voltage of the boosted voltage generating circuit 1200 in FIG. 4, that is, the boosted voltage VPP, has a value of about 5/2*VCC-Vth, and the boosted current I_VPP has a sum of the first output current IA_VPP of the first boosted voltage generator 1210 shown in FIG. 4 and the second output current IB_VPP of the second boosted voltage generator 1220 shown in FIG. 4.

Figure 12:
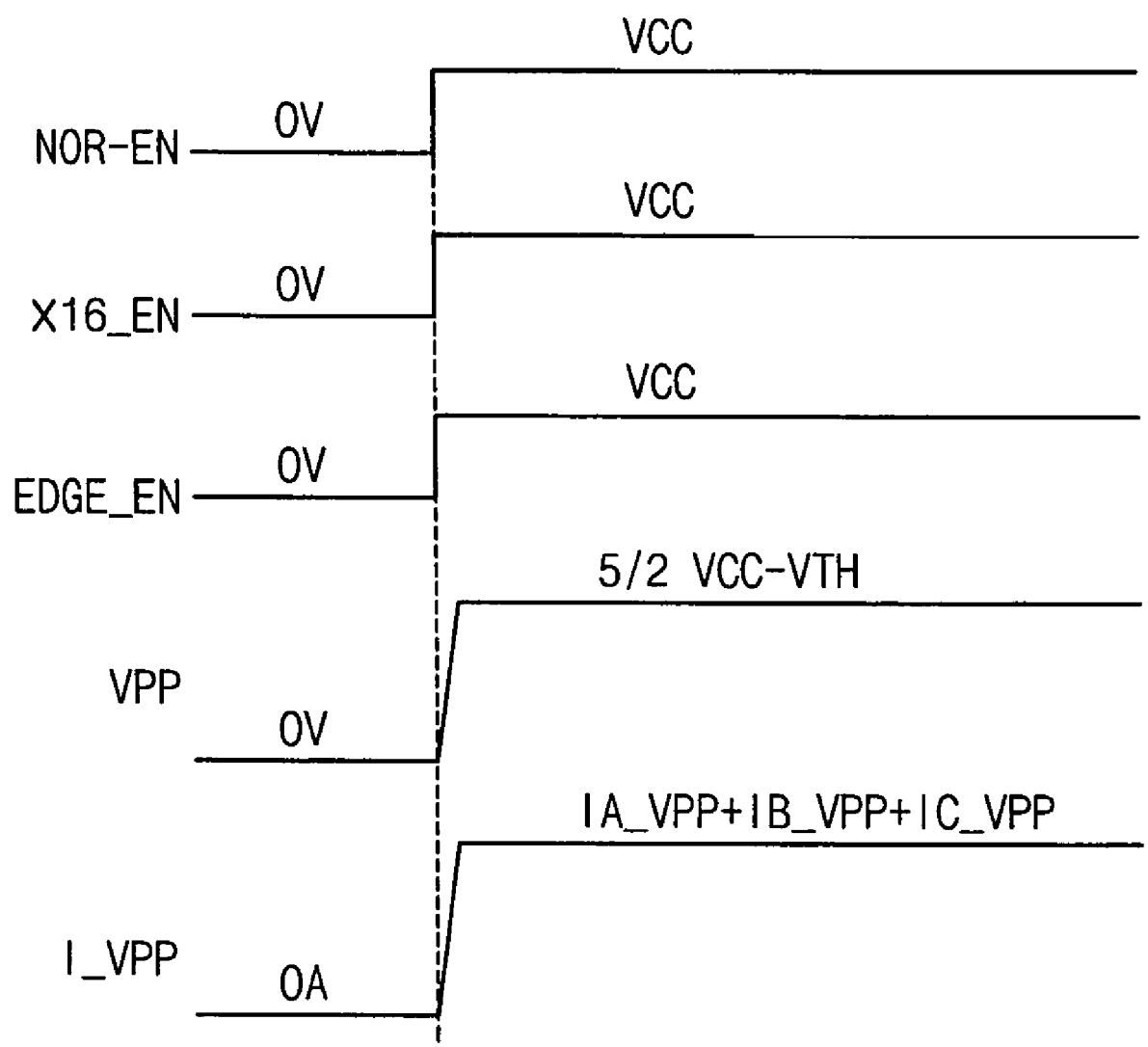
FIG. 12 is a diagram showing waveforms for a boosted voltage and a boosted current when the edge sub-arrays for the memory cell array shown in FIG. 4 are activated, in a case where the memory cell array has a data architecture of X16.

FIG. 12 is a diagram showing waveforms for a boosted voltage and a boosted current when the edge sub-arrays for the memory cell array shown in FIG. 4 are activated, in a case where the memory cell array has a data architecture of X16.

Referring to FIG. 12, when the memory cell array 1100 has a data architecture of X16 and edge sub-arrays of the memory cell array are activated, the first output control signal NOR_EN, the second output control signal X16_EN, and the third output control signal EDGE_EN are enabled. At this time, the output voltage of the boosted voltage generating circuit 1200 of FIG. 4, that is, the boosted voltage VPP, has a value of about 5/2*VCC-Vth, and the boosted current I_VPP is a sum of the first output current IA_VPP of the first boosted voltage generator 1210 shown in FIG. 4, the second output current IB_VPP of the second boosted voltage generator 1220 shown in FIG. 4, and the third output current IC_VPP of the third boosted voltage generator 1230 shown in FIG. 4.

Referring to FIGS. 9, 10, 11, and 12, it may be noted that a larger amount of boosted voltage is required to increase the driving current as a number of the sub-arrays that are to be activated at a time is increased. For example, when the memory cell array 1100 has a data architecture of X16 and edge sub-arrays of the memory cell array are activated, the number of sub-arrays in a memory bank that are activated at a time is three. Therefore, a boosted voltage with a large current driving capability is needed. At this time, all of the three boosted voltage generators 1210, 1220 and 1230, in the boosted voltage generating circuit 1200 in FIG. 4 output the boosted voltage VPP.

As described above, the disclosed boosted voltage generating circuit generates a boosted voltage with different current driving capabilities to activate the non-edge sub-arrays and the edge sub-arrays in a memory cell array of a semiconductor memory device. Furthermore, the disclosed boosted voltage generating circuit generates a boosted voltage with different current driving capabilities based on a data input/output architecture of a semiconductor memory device, to activate a memory cell array of the semiconductor memory device. Accordingly, the disclosed boosted voltage generating circuit may provide a boosted voltage with a desired current driving capability to a memory cell array and may also decrease noise in the semiconductor memory device.

While exemplary embodiments of the disclosed boosted voltage generating circuit and their features have been described in detail, it should be understood that various changes, substitutions and alterations may be made herein without departing from the scope of the disclosure.

What is claimed is:

1. A circuit for generating a boosted voltage in a semiconductor memory device, the semiconductor memory device including a memory cell array having a plurality of non-edge sub-arrays and at least one edge sub-array, the circuit comprising:
   a plurality of boosted voltage generators configured to generate a boosted voltage having different current driving capabilities to activate the non-edge sub-arrays and the at least one edge sub-array and to supply the boosted voltage to the memory cell array.

2. The circuit of claim 1, wherein the boosted voltage is configured to have different current driving capabilities based on a data input/output architecture of the semiconductor memory device.

3. The circuit of claim 2, wherein the plurality of boosted voltage generators comprise:
   a first boosted voltage generator configured to generate a first boosted voltage which activates the non-edge sub-arrays and to supply the first boosted voltage to the memory cell array;
   a second boosted voltage generator configured to generate a second boosted voltage which activates the non-edge sub-arrays or the at least one edge sub-array and to supply the second boosted voltage to the memory cell array when the semiconductor memory device has a data input/output architecture of X16; and
   a third boosted voltage generator configured to generate a third boosted voltage which activates the at least edge sub-array and to supply the third boosted voltage to the memory cell array.

4. The circuit of claim 3, wherein when the semiconductor memory device has a data input/output architecture of X4 or X8, the first boosted voltage generator is enabled to activate the non-edge sub-arrays.

5. The circuit of claim 3, wherein when the semiconductor memory device has a data input/output architecture of X4 or X8, the first boosted voltage generator and the third boosted voltage generator are enabled to activate the at least one edge sub-array.

6. The circuit of claim 3, wherein when the semiconductor memory device has a data input/output architecture of X16, the first boosted voltage generator and the second boosted voltage generator are enabled to activate the non-edge sub-arrays.

7. The circuit of claim 3, wherein when the semiconductor memory device has a data input/output architecture of X16, the first boosted voltage generator, the second boosted voltage generator, and the third boosted voltage generator are enabled to activate the at least one edge sub-array.

8. The circuit of claim 3, wherein when the semiconductor memory device has a data input/output architecture of X4 or X8, an output current of the circuit is equal to an output current of the first boosted voltage generator to activate the non-edge sub-arrays.

9. The circuit of claim 3, wherein when the semiconductor memory device has a data input/output architecture of X4 or X8, an output current of the circuit is equal to a sum of an output current of the first boosted voltage generator and an output current of the third boosted voltage generator to activate the at least one edge sub-array.

10. The circuit of claim 3, wherein when the semiconductor memory device has a data input/output architecture of X16, an output current of the circuit is equal to a sum of an output current of the first boosted voltage generator and an output current of the second boosted voltage generator to activate the non-edge sub-arrays.

11. The circuit of claim 3, wherein when the semiconductor memory device has a data input/output architecture of X16, an output current of the circuit is equal to a sum of an output current of the first boosted voltage generator, an output current of the second boosted voltage generator, and an output current of the third boosted voltage generator to activate the at least one edge sub-array.

12. The circuit of claim 3, wherein the first boosted voltage generator is configured to supply the first boosted voltage to the memory cell array in response to a first output control signal, the second boosted voltage generator is configured to supply the second boosted voltage to the memory cell array in response to a second output control signal, and the third boosted voltage generator is configured to supply the third boosted voltage to the memory cell array in response to a third output control signal.

13. The circuit of claim 12, wherein the first boosted voltage generator comprises:
    a first precharge circuit configured to precharge a first node based on a first supply voltage;
    a second precharge circuit configured to precharge a second node based on a second supply voltage;
    a first capacitive device configured to boost a voltage of the first node in response to a first pulse signal;
    a second capacitive device configured to boost a voltage of the second node in response to a second pulse signal;
    a coupling circuit configured to electrically couple the first node to the second node in response to a boost enable signal; and
    a transfer circuit configured to output the voltage of the second node in response to the first output control signal.

14. The circuit of claim 12, wherein the second boosted voltage generator comprises:
    a first precharge circuit configured to precharge a first node based on a first supply voltage;
    a second precharge circuit configured to precharge a second node based on a second supply voltage;
    a first capacitive device configured to boost a voltage of the first node in response to a first pulse signal;
    a second capacitive device configured to boost a voltage of the second node in response to a second pulse signal;
    a coupling circuit configured to electrically couple the first node to the second node in response to a boost enable signal; and
    a transfer circuit configured to output the voltage of the second node in response to the second output control signal.

15. The circuit of claim 12, wherein the third boosted voltage generator comprises:
    a first precharge circuit configured to precharge a first node based on a first supply voltage;
    a second precharge circuit configured to precharge a second node based on a second supply voltage;
    a first capacitive device configured to boost a voltage of the first node in response to a first pulse signal;
    a second capacitive device configured to boost a voltage of the second node in response to a second pulse signal;
    a coupling circuit configured to electrically couple the first node to the second node in response to a boost enable signal; and
    a transfer circuit configured to output the voltage of the second node in response to the third output control signal.

16. A semiconductor memory device, comprising:
    a memory cell array including a plurality of non-edge sub-arrays and a plurality of edge sub-arrays; and
    a boosted voltage generating circuit configured to generate a boosted voltage having different current driving capabilities to activate the non-edge sub-arrays and the edge sub-arrays and to supply the boosted voltage to the memory cell array.

17. The semiconductor memory device of claim 16, wherein the boosted voltage is configured to have different current driving capabilities based on a data input/output architecture of the semiconductor memory device.

18. The semiconductor memory device of claim 17, comprising:
    a first boosted voltage generator configured to generate a first boosted voltage which activates the non-edge sub-arrays and to supply the first boosted voltage to the memory cell array;
    a second boosted voltage generator configured to generate a second boosted voltage which activates the non-edge sub-arrays or the edge sub-arrays and to supply the second boosted voltage to the memory cell array when the semiconductor memory device has a data input/output architecture of X16; and
    a third boosted voltage generator configured to generate a third boosted voltage which activates the edge sub-arrays and to supply the third boosted voltage to the memory cell array.

19. The semiconductor memory device of claim 18, wherein when the semiconductor memory device has a data input/output architecture of X4 or X8, the first boosted voltage generator is enabled to activate the non-edge sub-arrays.

20. The semiconductor memory device of claim 18, wherein when the semiconductor memory device has a data input/output architecture of X4 or X8, the first boosted voltage generator and the third boosted voltage generator are enabled to activate the edge sub-arrays.

21. The semiconductor memory device of claim 18, wherein when the semiconductor memory device has a data input/output architecture of X16, the first boosted voltage generator and the second boosted voltage generator are enabled to activate the non-edge sub-arrays.

22. The semiconductor memory device of claim 18, wherein when the semiconductor memory device has a data input/output architecture of X16, the first boosted voltage generator, the second boosted voltage generator, and the third boosted voltage generator are enabled to activate the edge sub-arrays.

23. A method of generating a boosted voltage, comprising:
  generating a boosted voltage having different current driving capabilities for activating non-edge sub-arrays and edge sub-arrays; and
  supplying the boosted voltage to the non-edge sub-arrays and the edge sub-arrays.

24. The method of claim 23, wherein the boosted voltage is configured to have different current driving capabilities based on a data input/output architecture of a semiconductor memory device.

25. The method of claim 24, wherein generating the boosted voltage having different current driving capabilities comprises:
  generating a first boosted voltage which activates the non-edge sub-arrays to supply the first boosted voltage to the memory cell array;
  generating a second boosted voltage which activates the non-edge sub-arrays or the edge sub-arrays to supply the second boosted voltage to the memory cell array when the semiconductor memory device has a data input/output architecture of X16; and
  generating a third boosted voltage which activates the edge sub-arrays to supply the third boosted voltage to the memory cell array.

26. The method of claim 25, further including enabling the first boosted voltage to activate the non-edge sub-arrays when the semiconductor memory device has a data input/output architecture of X4 or X8.

27. The method of claim 25, further including enabling the third boosted voltage and the first boosted voltage to activate the edge sub-arrays when the semiconductor memory device has a data input/output architecture of X4 or X8.

28. The method of claim 25, further including enabling the first boosted voltage and the second boosted voltage to activate the non-edge sub-arrays when the semiconductor memory device has a data input/output architecture of X16.

29. The method of claim 25, further including enabling the first boosted voltage, the second boosted voltage, and the third boosted voltage to activate the edge sub-arrays when the semiconductor memory device has a data input/output architecture of X16.

* * * * *